United States Patent
Yoneda et al.

(10) Patent No.: US 8,563,342 B2
(45) Date of Patent: Oct. 22, 2013

(54) METHOD OF MAKING SEMICONDUCTOR OPTICAL INTEGRATED DEVICE BY ALTERNATELY ARRANGING SPACERS WITH INTEGRATED DEVICE ARRAYS

(75) Inventors: Yoshihiro Yoneda, Yokohama (JP); Hirohiko Kobayashi, Yokohama (JP); Kenji Koyama, Yokohama (JP); Masaki Yanagisawa, Yokohama (JP); Kenji Hiratsuka, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/479,567

(22) Filed: May 24, 2012

(65) Prior Publication Data

US 2012/0309121 A1 Dec. 6, 2012

(30) Foreign Application Priority Data

May 31, 2011 (JP) ................................. 2011-121863

(51) Int. Cl.
*H01L 21/00* (2006.01)
(52) U.S. Cl.
USPC ........ 438/31; 438/74; 438/109; 257/E21.002; 372/36; 372/50.12
(58) Field of Classification Search
USPC ........................ 372/36, 50; 438/31, 74, 109; 257/E21.002
See application file for complete search history.

(56) References Cited

U.S. PATENT DOCUMENTS

| | | | | |
|---|---|---|---|---|
| 3,962,714 A * | 6/1976 | King ............................... 359/344 |
| 5,147,825 A * | 9/1992 | Koch et al. ..................... 438/507 |
| 5,311,536 A * | 5/1994 | Paoli et al. .................. 372/50.12 |
| 5,522,005 A * | 5/1996 | Moretti et al. ................. 385/129 |
| 5,543,353 A * | 8/1996 | Suzuki et al. ................... 438/31 |
| 5,709,980 A * | 1/1998 | Schilling ....................... 430/321 |
| 5,891,748 A * | 4/1999 | Sakata ............................ 438/31 |
| 5,985,684 A * | 11/1999 | Marshall et al. ................ 438/26 |
| 6,036,771 A * | 3/2000 | Sakata ........................... 117/89 |
| 6,090,633 A * | 7/2000 | Yu et al. .......................... 438/15 |
| 6,134,368 A * | 10/2000 | Sakata .......................... 385/131 |
| 6,185,238 B1 * | 2/2001 | Onomura et al. ........... 372/46.01 |
| 6,194,235 B1 * | 2/2001 | Ma .................................. 438/14 |
| 6,383,829 B1 * | 5/2002 | Sakata ............................ 438/31 |
| 6,472,682 B1 * | 10/2002 | Kuramoto ....................... 257/14 |
| 6,479,325 B2 * | 11/2002 | Ozawa .......................... 438/119 |

(Continued)

FOREIGN PATENT DOCUMENTS

JP 7-263655 10/1995

*Primary Examiner* — Kimberly Rizkallah
*Assistant Examiner* — Caleb Henry
(74) *Attorney, Agent, or Firm* — Smith, Gambrell & Russell, LLP

(57) ABSTRACT

A method of making a semiconductor optical integrated device includes the steps of forming, on a substrate, a plurality of semiconductor integrated devices including a first optical semiconductor element having a first bonding pad and a second optical semiconductor element; forming a plurality of bar-shaped semiconductor optical integrated device arrays by cutting the substrate, each of the semiconductor optical integrated device arrays including two or more semiconductor optical integrated devices; alternately arranging the plurality of semiconductor optical integrated device arrays and a plurality of spacers in a thickness direction of the substrate so as to be fixed in place; and forming a coating film on a facet of the semiconductor optical integrated device array. Furthermore, the spacer has a movable portion facing the first bonding pad, the movable portion protruding toward the first bonding pad and being displaceable in a protruding direction.

7 Claims, 8 Drawing Sheets

(56) References Cited

U.S. PATENT DOCUMENTS

| | | | |
|---|---|---|---|
| 6,597,713 B2* | 7/2003 | Ouchi | 372/36 |
| 6,600,224 B1* | 7/2003 | Farquhar et al. | 257/731 |
| 6,600,842 B2* | 7/2003 | Yamada | 385/2 |
| 6,624,000 B1* | 9/2003 | Coldren | 438/29 |
| 6,678,289 B2* | 1/2004 | Kim | 372/20 |
| 6,678,302 B2* | 1/2004 | Nakamura | 372/50.1 |
| 6,687,268 B2* | 2/2004 | Kitamura et al. | 372/22 |
| 6,706,546 B2* | 3/2004 | Inao et al. | 438/31 |
| 6,728,275 B2* | 4/2004 | Stephens et al. | 372/36 |
| 6,730,134 B2* | 5/2004 | Neidich | 29/25.01 |
| 6,763,581 B2* | 7/2004 | Hirai et al. | 29/852 |
| 6,815,786 B2* | 11/2004 | Ogasawara et al. | 257/432 |
| 6,836,357 B2* | 12/2004 | Wang et al. | 359/344 |
| 6,836,499 B2* | 12/2004 | Capasso et al. | 372/50.22 |
| 6,901,086 B2* | 5/2005 | Li | 372/7 |
| 7,018,861 B2* | 3/2006 | Fang et al. | 438/31 |
| 7,061,956 B2* | 6/2006 | Eitel | 372/50.1 |
| 7,106,774 B2* | 9/2006 | Fisher | 372/46.01 |
| 7,114,961 B2* | 10/2006 | Williams | 439/66 |
| 7,180,927 B2* | 2/2007 | Kwak et al. | 372/50.1 |
| 7,184,207 B1* | 2/2007 | Walker et al. | 359/344 |
| 7,257,138 B2* | 8/2007 | Sato et al. | 372/36 |
| 7,288,422 B2* | 10/2007 | Park et al. | 438/32 |
| 7,426,227 B2* | 9/2008 | Kume et al. | 372/43.01 |
| 7,460,576 B2* | 12/2008 | Hashimoto | 372/50.22 |
| 7,483,464 B2* | 1/2009 | Kuwata et al. | 372/50.1 |
| 7,577,319 B2* | 8/2009 | Makino et al. | 385/2 |
| 7,587,817 B2* | 9/2009 | Williams | 29/884 |
| 7,597,561 B2* | 10/2009 | Radza et al. | 439/66 |
| 7,599,414 B2* | 10/2009 | Miyajima et al. | 372/34 |
| 7,622,315 B2* | 11/2009 | Mason et al. | 438/31 |
| 7,636,378 B2* | 12/2009 | Kitatani et al. | 372/50.1 |
| 7,696,593 B2* | 4/2010 | Yoneda et al. | 257/458 |
| 7,724,791 B2* | 5/2010 | Stephens, IV | 372/36 |
| 7,758,351 B2* | 7/2010 | Brown et al. | 439/66 |
| 7,773,840 B2* | 8/2010 | Kwakernaak et al. | 385/29 |
| 7,811,844 B2* | 10/2010 | Carothers et al. | 438/31 |
| 7,873,090 B2* | 1/2011 | Onishi et al. | 372/50.12 |
| 7,875,946 B2* | 1/2011 | Yasuoka et al. | 257/438 |
| 7,881,353 B2* | 2/2011 | Kageyama et al. | 372/46.01 |
| 8,213,479 B2* | 7/2012 | Doerfel et al. | 372/50.12 |
| 8,236,590 B2* | 8/2012 | Matsui et al. | 438/31 |
| 8,243,767 B2* | 8/2012 | Miyamoto | 372/46.012 |
| 2001/0008539 A1* | 7/2001 | Kudo | 372/50 |
| 2001/0041379 A1* | 11/2001 | Sakata | 438/22 |
| 2002/0018503 A1* | 2/2002 | Nakamura | 372/50 |
| 2002/0090013 A1* | 7/2002 | Murry et al. | 372/36 |
| 2002/0094004 A1* | 7/2002 | Furukawa | 372/46 |
| 2002/0181533 A1* | 12/2002 | Vail et al. | 372/50 |
| 2003/0007535 A1* | 1/2003 | Haase et al. | 372/50 |
| 2003/0012240 A1* | 1/2003 | Yamamoto et al. | 372/46 |
| 2003/0039278 A1* | 2/2003 | Nishikawa et al. | 372/36 |
| 2003/0164444 A1* | 9/2003 | Yoneda et al. | 250/214.1 |
| 2003/0210725 A1* | 11/2003 | Prassas et al. | 372/50 |
| 2003/0219047 A1* | 11/2003 | Treusch | 372/36 |
| 2004/0042069 A1* | 3/2004 | Fisher | 359/344 |
| 2004/0086009 A1* | 5/2004 | Li | 372/36 |
| 2004/0124424 A1* | 7/2004 | Tatsumi | 257/79 |
| 2004/0174918 A1* | 9/2004 | Kwak et al. | 372/46 |
| 2004/0179569 A1* | 9/2004 | Sato et al. | 372/50 |
| 2004/0196879 A1* | 10/2004 | Stephens et al. | 372/36 |
| 2005/0069266 A1* | 3/2005 | Kouta et al. | 385/92 |
| 2005/0074197 A1* | 4/2005 | Tada et al. | 385/14 |
| 2005/0230707 A1* | 10/2005 | Kawasaki et al. | 257/197 |
| 2006/0006529 A1* | 1/2006 | Lin | 257/734 |
| 2006/0113107 A1* | 6/2006 | Williams | 174/256 |
| 2006/0141649 A1* | 6/2006 | Joyner et al. | 438/31 |
| 2006/0215715 A1* | 9/2006 | Kouta et al. | 372/36 |
| 2006/0285567 A1* | 12/2006 | Otoma | 372/50.1 |
| 2007/0019698 A1* | 1/2007 | Fukuhisa et al. | 372/50.121 |
| 2007/0116077 A1* | 5/2007 | Farmer et al. | 372/50.12 |
| 2007/0171515 A1* | 7/2007 | Kang et al. | 359/333 |
| 2007/0217467 A1* | 9/2007 | DeFranza et al. | 372/50.12 |
| 2007/0217468 A1* | 9/2007 | DeFranza et al. | 372/50.12 |
| 2007/0217469 A1* | 9/2007 | DeFranza et al. | 372/50.12 |
| 2007/0217470 A1* | 9/2007 | DeFranza et al. | 372/50.12 |
| 2008/0054272 A1* | 3/2008 | Sato et al. | 257/79 |
| 2008/0056316 A1* | 3/2008 | Stephens et al. | 372/36 |
| 2008/0285603 A1* | 11/2008 | Mason et al. | 372/20 |
| 2008/0290358 A1* | 11/2008 | Hiratsuka | 257/98 |
| 2008/0310012 A1* | 12/2008 | Tanaka et al. | 359/344 |
| 2009/0010291 A1* | 1/2009 | Takahashi et al. | 372/45.011 |
| 2009/0041073 A1* | 2/2009 | Matsui et al. | 372/34 |
| 2009/0122393 A1* | 5/2009 | Morito et al. | 359/344 |
| 2009/0213884 A1* | 8/2009 | Rosso et al. | 372/26 |
| 2009/0245312 A1* | 10/2009 | Kageyama et al. | 372/46.01 |
| 2009/0267103 A1* | 10/2009 | Muraki et al. | 257/99 |
| 2009/0323749 A1* | 12/2009 | Hashimoto | 372/45.01 |
| 2010/0075514 A1* | 3/2010 | Williams | 439/66 |
| 2010/0117104 A1* | 5/2010 | Murata | 257/94 |
| 2010/0124245 A1* | 5/2010 | Kobayashi | 372/46.01 |
| 2010/0202482 A1* | 8/2010 | Masui et al. | 372/43.01 |
| 2010/0279447 A1* | 11/2010 | Matsui et al. | 438/31 |
| 2010/0303115 A1* | 12/2010 | Yagi et al. | 372/46.012 |
| 2010/0311195 A1* | 12/2010 | Matsui et al. | 438/31 |
| 2010/0328753 A1* | 12/2010 | Hayashi et al. | 359/279 |
| 2011/0091147 A1* | 4/2011 | Hashimoto | 385/2 |
| 2011/0091151 A1* | 4/2011 | Hashimoto | 385/14 |
| 2011/0134513 A1* | 6/2011 | Kim et al. | 359/344 |
| 2011/0293216 A1* | 12/2011 | Lipson et al. | 385/14 |
| 2012/0211878 A1* | 8/2012 | Popovic et al. | 257/690 |

* cited by examiner

METHOD OF MAKING SEMICONDUCTOR OPTICAL INTEGRATED DEVICE BY ALTERNATELY ARRANGING SPACERS WITH INTEGRATED DEVICE ARRAYS

BACKGROUND OF THE INVENTION

1. Field of the Invention

The present invention relates to a method of making a semiconductor optical integrated device.

2. Description of the Related Art

To date, semiconductor optical integrated devices having a butt joint structure have been known. For example, Japanese Unexamined Patent Application Publication No. 7-263655 describes a semiconductor optical integrated device including a semiconductor laser and an electro-absorption (EA) modulator. The semiconductor laser and the electro-absorption (EA) modulator are optically coupled to each other through a butt joint and integrated with each other on a single substrate.

SUMMARY OF THE INVENTION

A semiconductor optical integrated device includes a first optical semiconductor element that is, for example, a semiconductor laser; and a second optical semiconductor element that is, for example, an optical modulator. The first and second optical semiconductor elements are monolithically integrated with each other on a single substrate. Each of the optical semiconductor elements has a stripe mesa structure including an optical waveguide layer. The stripe mesa structures are formed by a so-called butt joint method and are coupled to each other. In many cases, these stripe mesa structures are buried with, for example, a semi-insulating semiconductor, a resin, or the like. An electrode is formed on each of the stripe mesa structures. Moreover, bonding pads for wire-bonding are formed near the electrodes. The bonding pads are electrically connected to the electrodes. It is preferable that resin layers be formed between the bonding pads and semiconductor portions below the bonding pads so that the capacitance of the device can be reduced. A high reflection (HR) film or an anti-reflection (AR) film is formed on a facet of the semiconductor optical integrated device having such a structure. When forming the high reflection (HR) film or the anti-reflection (AR) film on the facet of the device, a plurality of semiconductor optical integrated devices and a plurality of spacers are alternately arranged in the thickness direction of the substrates so as to be fixed in place, and then the high reflection (HR) film or the anti-reflection (AR) film is formed on the facet.

However, depending on the structure of the semiconductor optical integrated device, the bonding pads of the optical semiconductor elements may have different heights from the main surface of the substrate. In such a case, when the plurality of semiconductor optical integrated devices and the plurality of spacers are alternately arranged, gaps are generated between the spacers and the bonding pads having small heights. As a result, it is difficult to stably fix the plurality of semiconductor optical integrated devices in place. Moreover, a coating-film material may flow to a surface of such a bonding pad through to the gap, and the surface of the bonding pad may become covered by the coating-film material. When the surface of the bonding pad is covered by the coating-film material, a bonding wire adheres poorly to the bonding pad. So, it is difficult to connect the bonding wire to the bonding pad, mechanically and electrically.

According to the present invention, a method of making a semiconductor optical integrated device includes the steps of preparing a substrate having a main surface; forming a plurality of semiconductor integrated devices on the main surface of the substrate, the semiconductor integrated devices being arranged in a first direction and in a second direction that intersects the first direction, the semiconductor integrated device including a first optical semiconductor element and a second optical semiconductor element disposed adjacent to the first optical semiconductor element in the first direction; forming a plurality of bar-shaped semiconductor optical integrated device arrays by cutting the substrate in the second direction, each of the semiconductor optical integrated device arrays including two or more semiconductor optical integrated devices arranged linearly in the second direction; alternately arranging the plurality of semiconductor optical integrated device arrays and a plurality of spacers in a thickness direction of the substrate so as to be fixed in place; and forming a coating film on a facet of the semiconductor optical integrated device array. The first optical semiconductor element includes a first stripe mesa structure, a first electrode disposed on the first stripe mesa structure, and a first bonding pad electrically connected to the first electrode, the first stripe mesa structure including a first optical waveguide layer. The second optical semiconductor element includes a second stripe mesa structure, a second electrode disposed on the second stripe mesa structure, and a second bonding pad electrically connected to the second electrode, the second stripe mesa structure including a second optical waveguide layer optically coupled to the first optical waveguide layer. Furthermore, the spacer has a movable portion facing the first bonding pad, the movable portion protruding toward the first bonding pad and being displaceable in a protruding direction.

In the method of making the semiconductor optical integrated device, the spacer has a movable portion facing the first bonding pad. The movable portion protrudes toward the first bonding pad and is displaceable in the protruding direction. Thus, when the plurality of semiconductor optical integrated device arrays and the plurality of spacers are alternately arranged in the arrangement step, the movable portion can come into contact with the first bonding pad without fail, and thereby generation of a gap between the first bonding pad and the spacer can be prevented. Therefore, with the method of making the semiconductor optical integrated device described above, in the step of forming a coating film on a facet of the semiconductor optical integrated device array, the semiconductor optical integrated device arrays can be stably fixed in place and flow of a coating-film material to a surface of the bonding pad can be reduced.

In the method of making a semiconductor optical integrated device according to the present invention, in the step of forming the plurality of semiconductor integrated devices, the first bonding pad may have a height from a back surface of the substrate, the height of the first bonding pad being different from a height of the second bonding pad from the back surface of the substrate. This method is particularly effective when the height of the first bonding pad from the back surface of the substrate is different from the height of the second bonding pad. Also in this case, the semiconductor optical integrated device array can be stably fixed in place, and thereby flow of a coating-film material to a surface of the bonding pad can be effectively reduced.

In the method of making a semiconductor optical integrated device according to the present invention, the movable portion of the spacer may be elastically deformable in the protruding direction. With such a structure, the amount of protrusion of the movable portion can be easily adjusted, and thereby generation of a gap between the first bonding pad and the spacer can be appropriately prevented.

In the method of making a semiconductor optical integrated device according to the present invention, the movable portion of the spacer may have a length in the second direction, the length of the movable portion being larger than a distance between outer side surfaces of the first bonding pads of the semiconductor optical integrated devices that are located at end of the semiconductor optical integrated device array, respectively. In this case, the relative positions of the movable portion of the spacer and the first bonding pad in the second direction may have tolerances.

In the method of making a semiconductor optical integrated device according to the present invention, the step of forming the plurality of semiconductor integrated devices may include a step of forming a first dummy pad on a side opposite to a side on which the first bonding pad is disposed with the first electrode therebetween. In addition, the first dummy pad may be formed simultaneously with the first bonding pad. With the first dummy pad, structures that are higher than the first stripe mesa structure are disposed on the left and right sides of the optical waveguide portion. Due to this structure, in the arrangement step, the spacer is prevented from coming into contact with the optical waveguide portion, and thereby the optical waveguide portion can be appropriately protected. Moreover, with the first dummy pad, when arranging the spacers in the arrangement step, parallelism between the spacers and the semiconductor optical integrated device arrays in a direction that intersects the optical waveguide can be maintained. Furthermore, with the first dummy pad, balance of mechanical stresses in the semiconductor optical integrated device can be achieved. Because the first dummy pad can be formed simultaneously with forming the first bonding pad, the first dummy pad can be easily formed without performing an additional step.

In the method of making a semiconductor optical integrated device according to the present invention, the step of forming the plurality of semiconductor integrated devices may include a step of forming a second dummy pad on a side opposite to a side on which the second bonding pad is disposed with the second electrode therebetween. In addition, the second dummy pad may be formed simultaneously with the second bonding pad.

In the method of making a semiconductor optical integrated device according to the present invention, the step of forming the plurality of semiconductor integrated devices may include a step of forming a resin layer around the first stripe mesa structure, and the first bonding pad may be formed on the resin layer. The step of forming the plurality of semiconductor integrated devices may include a step of forming a resin layer around the second stripe mesa structure, and the second bonding pad may be formed on the resin layer.

DESCRIPTION OF THE PREFERRED EMBODIMENTS

Hereinafter, a method of making a semiconductor optical integrated device according to the present invention will be described in detail with respect to the drawings. In the description, the same elements will be denoted by the same numerals and redundant description will be omitted.

Figure 1:
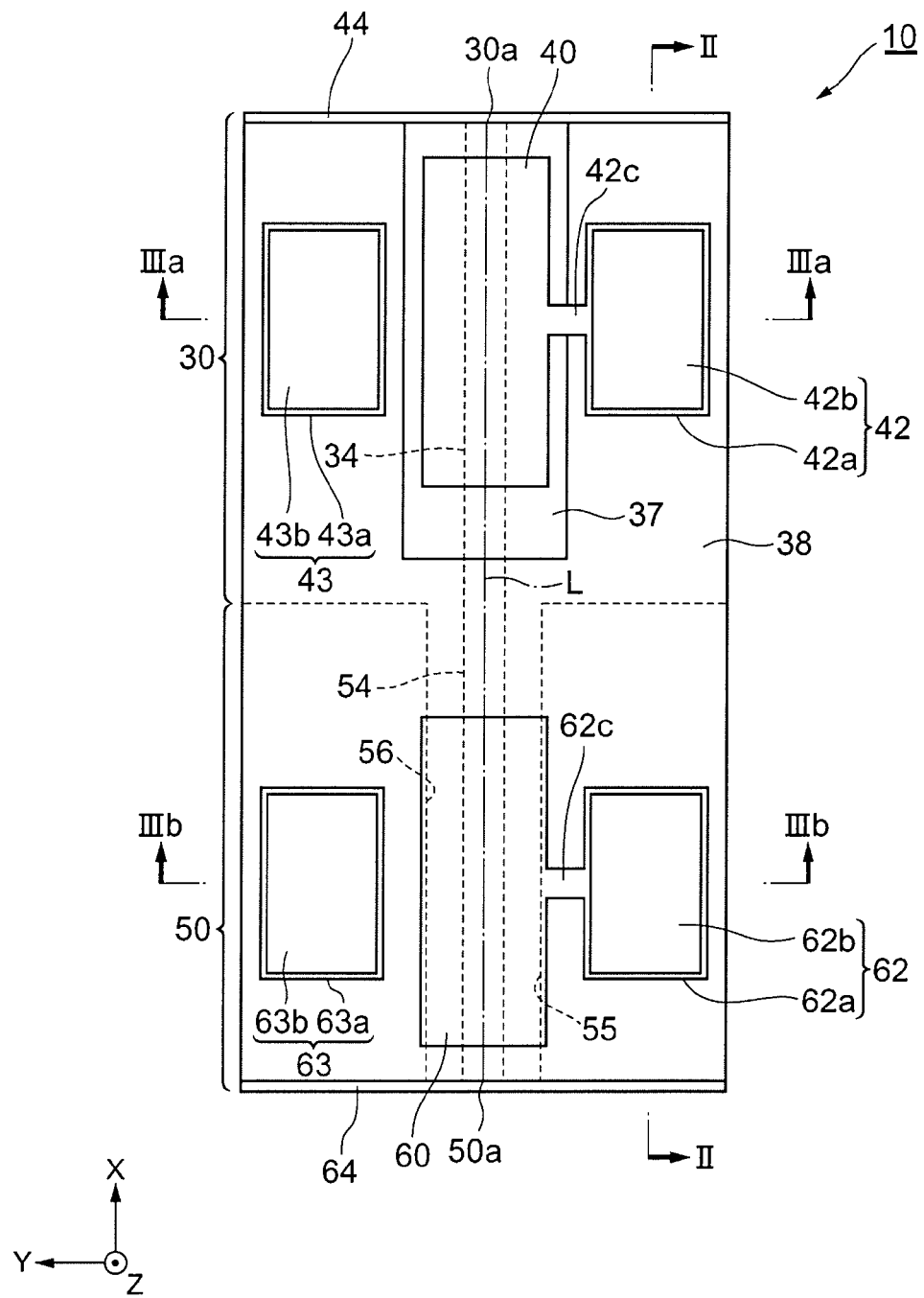
FIG. 1 is a plan view of a semiconductor optical integrated device according to an embodiment.
Figure 2:
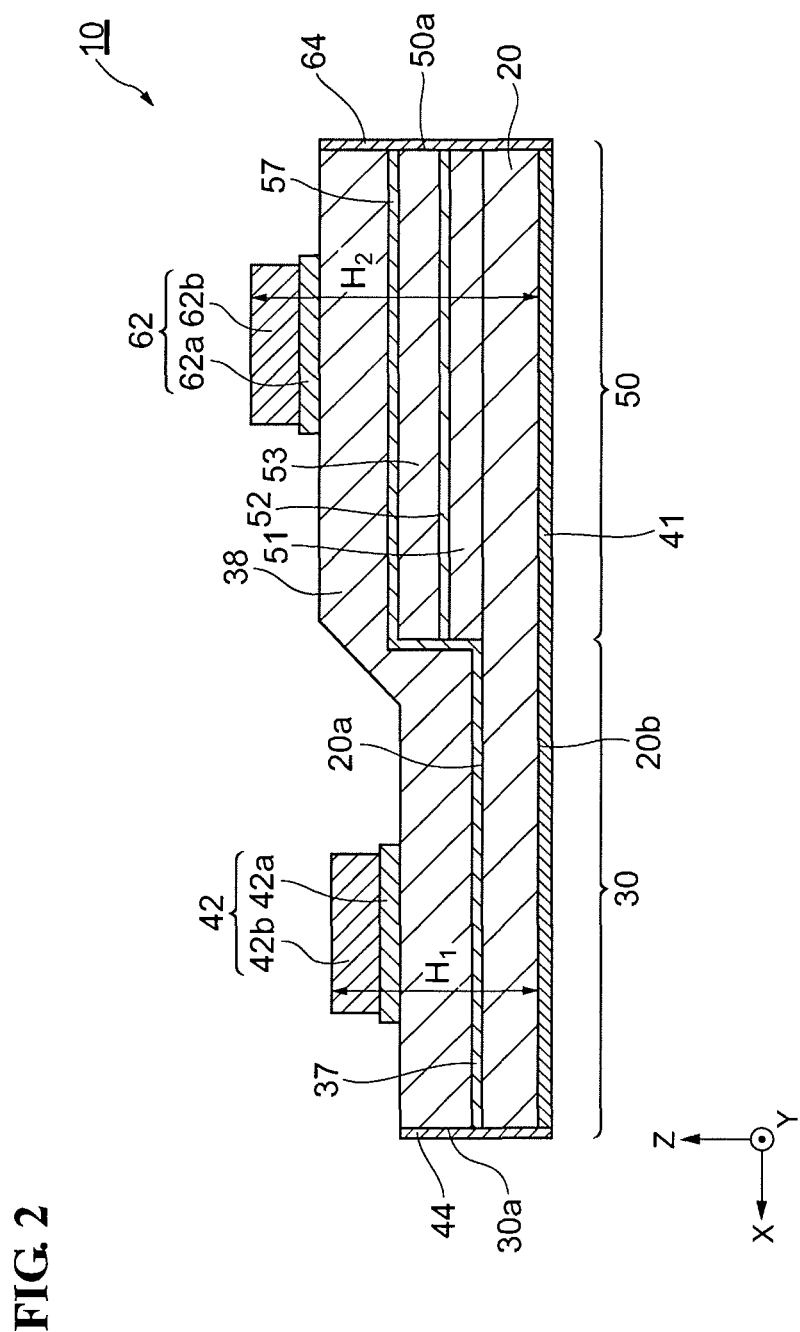
FIG. 2 is a sectional view of the semiconductor optical integrated device taken along line II-II of FIG. 1.
Figure 3A:
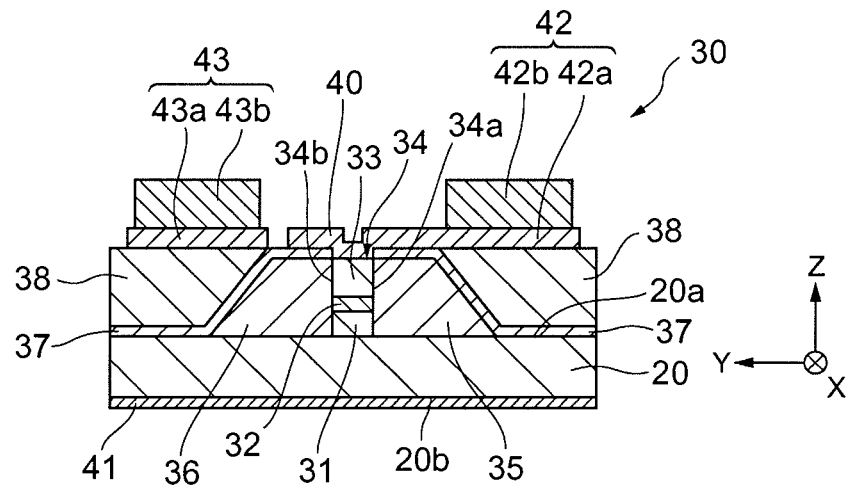
FIG. 3A is a sectional view of the semiconductor optical integrated device taken along line IIIa-IIIa of FIG. 1.
Figure 3B:
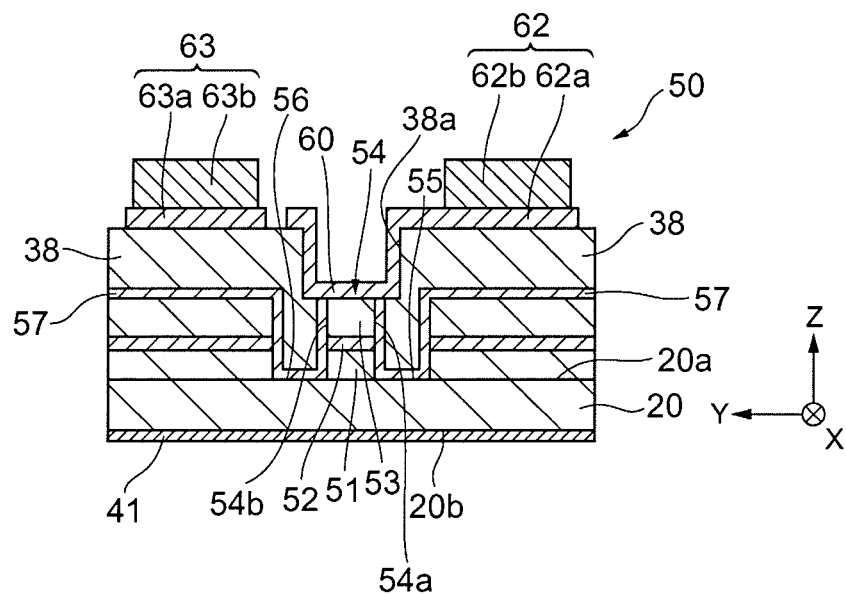
FIG. 3B is a sectional view of the semiconductor optical integrated device taken along line IIIb-IIIb of FIG. 1.

First, the structure of a semiconductor optical integrated device 10 made by the method according to the present embodiment will be described. The semiconductor optical integrated device 10 is a monolithic integrated semiconductor optical waveguide device that is mainly used in an optical fiber communication system. FIG. 1 is a plan view of the semiconductor optical integrated device 10. FIG. 2 is a sectional view of the semiconductor optical integrated device 10 taken along line II-II of FIG. 1. FIG. 3A is a sectional view of the semiconductor optical integrated device 10 taken along line IIIa-IIIa of FIG. 1. FIG. 3B is a sectional view of the semiconductor optical integrated device 10 taken along line IIIb-IIIb of FIG. 1. For ease of understanding, an XYZ coordinate system is also illustrated in each of FIGS. 1 to 3B.

As illustrated in FIG. 1, the semiconductor optical integrated device 10 includes a substrate 20; a first optical semiconductor element 30 that is, for example, a semiconductor laser; and a second optical semiconductor element 50 that is, for example, a semiconductor optical modulator. The substrate 20 is composed of, for example, a conductive semiconductor such as n-type InP. The substrate 20 has a main surface 20a and a back surface 20b. The first optical semiconductor element 30 has a structure of a semiconductor laser. The second optical semiconductor element 50 has a structure of an optical modulator. The first and second optical semiconductor elements 30 and 50 are disposed adjacent to each other in the X-axis direction (first direction) on the main surface 20a of the substrate 20.

As illustrated in FIG. 3A, the first optical semiconductor element 30 includes an n-type semiconductor region 31, an active layer 32 (first optical waveguide layer), and a p-type semiconductor region 33, which are sequentially stacked on the main surface 20a of the substrate 20. The n-type semiconductor region 31 is composed of, for example, n-type InP. The n-type semiconductor region 31 functions as lower cladding of an optical waveguide structure. The p-type semiconductor region 33 is composed of, for example, a p-type InP. The p-type semiconductor region 33 functions as upper cladding of the optical waveguide structure. The p-type semiconductor region 33 includes a p-type contact layer. The p-type contact layer forms an Ohmic contact with an electrode 40 described below. The p-type contact layer is composed of, for example, p-type InGaAs. The p-type contact layer is heavily doped with a p-type impurity (for example, Zn).

The active layer 32 is disposed between the n-type semiconductor region 31 and the p-type semiconductor region 33. The active layer 32 functions as a core layer of the waveguide structure. The active layer 32 generates light, amplifies the light, and guides the light. The active layer 32 is composed of, for example, a single InGaAs layer having a bandgap wavelength of about 1.55 μM. Alternatively, the active layer 32 may have a multiple quantum well (MQW) structure in which well layers and barrier layers, which are composed of InGaAsP with different compositions, are alternately stacked. The well layers of the multiple quantum well (MQW) structure may be composed of, for example, InGaAsP having a bandgap wavelength of about 1.6 μm. The barrier layers may be composed of, for example, InGaAsP having a bandgap wavelength of 1.25 μm. In this case, the active layer having the MQW structure emits light with a wavelength of about 1.55 μm.

As illustrated in FIG. 3A, the n-type semiconductor region 31, the active layer 32, and the p-type semiconductor region 33 form a stripe mesa structure 34 (first stripe mesa structure). The stripe mesa structure 34 has a pair of side surfaces 34a and 34b extending in the X-axis direction. A part of an optical waveguide axis L (see FIG. 1) extends through the active layer 32 of the stripe mesa structure 34 in the X-axis direction. On the main surface 20a, burying semiconductor regions 35 and 36 are formed on both sides of the stripe mesa structure 34. The burying semiconductor regions 35 and 36 are composed of, for example, a semi-insulating semiconductor such as Fe-doped InP. The side surfaces 34a and 34b of the stripe mesa structure 34 are respectively buried with the burying semiconductor regions 35 and 36. An insulating protection film 37 is formed on the burying semiconductor regions 35 and 36 and on portions of the main surface 20a outside the burying semiconductor regions 35 and 36. The insulating protection film 37 is composed of, for example, a dielectric film of $SiO_2$, SiON, or SiN.

A resin layer 38 is formed on portions of the main surface 20a on the outer sides the burying semiconductor regions 35 and 36 (on the sides opposite to those in contact with the stripe mesa structure 34). The resin layer 38 is composed of, for example, a bisbenzocyclobutene (BCB) resin, a polyimide resin, or the like. The thickness of the resin layer 38 is substantially the same as those of the burying semiconductor regions 35 and 36. The height of the surface of the insulating protection film 37 on the burying semiconductor regions 35 and 36 from the main surface 20a is substantially the same as the height of the surface of the resin layer 38 from the main surface 20a. Therefore, the surface of the insulating protection film 37 on the burying semiconductor regions 35 and 36 is flush with the surface of the resin layer 38. In the present embodiment, the thickness of the resin layer 38 is in the range of 2 to 3 μm.

The insulating protection film 37 has an opening above the stripe mesa structure 34. The electrode 40 (first electrode) is formed in the opening. The electrode 40 is directly in contact with the p-type contact layer of the p-type semiconductor region 33 through the opening. The electrode 40 forms an Ohmic contact with the p-type contact layer of the p-type semiconductor region 33. The electrode 40 includes a lower layer and an upper layer. The lower layer has, for example, a stacked structure of Au/Zn/Au or a single layer of Pt. The upper layer has, for example, a stacked structure of TiW/Au or Ti/Pt/Au. As illustrated in FIG. 1, the electrode 40 has a shape extending in the X-axis direction on the stripe mesa structure 34 of the first optical semiconductor element 30. An electrode 41 is formed on the back surface 20b of the substrate 20.

A bonding pad 42 is disposed near the electrode 40. The bonding pad 42 is formed on the resin layer 38. The bonding pad 42 includes a barrier metal layer 42a and a Au-plating layer 42b. The barrier metal layer 42a has, for example, a stacked structure of TiW/Au or Ti/Pt/Au and is formed simultaneously with the upper layer of the electrode 40. The barrier metal layer 42a includes a wiring portion 42c extending to the electrode 40, and the wiring portion 42c is electrically connected to the electrode 40. The height $H_1$ of the bonding pad 42 illustrated in FIG. 2 (i.e. the distance from the back surface 20b to the upper surface of the Au-plating layer 42b) is, for example, in the range of 100 to 200 μm.

A dummy pad 43 is formed on the resin layer 38 on a side opposite to a side on which the bonding pad 42 is disposed with the electrode 40 therebetween. As with the bonding pad 42, the dummy pad 43 includes a barrier metal layer 43a and a Au-plating layer 43b. The shape of the dummy pad 43 in plan view and the height of the dummy pad 43 from the main surface 20a are the same as those of the bonding pad 42. When the dummy pad 43 is formed, structures that are higher than the optical waveguide portion (the stripe mesa structure 34) are disposed on the left and right sides of the optical waveguide portion. With this structure, in the arrangement step described below, a spacer is prevented from coming into contact with the optical waveguide portion, so that the optical waveguide portion can be appropriately protected. The structures (pads 42 and 43) having the same height are disposed on the left and right sides of the optical waveguide portion. Therefore, when arranging the spacers in the arrangement step described below, parallelism between the spacers and the semiconductor optical integrated device arrays with respect to a direction that intersects the optical waveguide can be maintained. Because the dummy pad 43 is a structure that is symmetric to the bonding pad 42 with respect to the optical waveguide portion, balance of mechanical stresses in the semiconductor optical integrated device 10 can be achieved.

The electrode 41 is formed on the entirety of the back surface 20b of the substrate 20. The electrode 41 is, for example, an Ohmic electrode of AuGe/Au or AuGe/Ti/Pt/Au.

As illustrated in FIG. 3B, the second optical semiconductor element 50 includes an n-type semiconductor region 51, a core layer 52 (second optical waveguide layer), and a p-type semiconductor region 53, which are sequentially stacked on the main surface 20a of the substrate 20. The n-type semiconductor region 51 is composed of, for example, n-type InP. The n-type semiconductor region 51 functions as lower cladding of an optical waveguide structure. The p-type semiconductor region 53 is composed of, for example, a p-type InP. The p-type semiconductor region 53 functions as upper cladding of the optical waveguide structure. The p-type semiconductor region 53 includes a p-type contact layer. The p-type contact layer forms an Ohmic contact with an electrode 60 described below. The p-type contact layer is composed of, for example, p-type InGaAs. The p-type contact layer is heavily doped with a p-type impurity (for example, Zn).

The core layer 52 is disposed between the n-type semiconductor region 51 and the p-type semiconductor region 53. The core layer 52 is optically coupled to the active layer 32 of the first optical semiconductor element 30. The core layer 52 guides laser light generated by the first optical semiconductor element 30 and modulates the laser light. The core layer 52 is composed of, for example, a single InGaAs layer having a bandgap wavelength of about 1.48 μm. Alternatively, the core layer 52 may have a multiple quantum well (MQW) structure (MQW) in which AlGaInAs well layers having a bandgap wavelength of 1.5 μm and AlInAs barrier layers are alternately stacked.

As illustrated in FIG. 3B, the n-type semiconductor region 51, the core layer 52, and the p-type semiconductor region 53 form a stripe mesa structure 54 (second stripe mesa structure).

The stripe mesa structure 54 has a pair of side surfaces 54a and 54b extending in the X-axis direction. A part of an optical waveguide axis L (see FIG. 1), which is a part excluding the part extending through the first optical semiconductor element 30, extends through the core layer 52 of the stripe mesa structure 54 in the X-axis direction. Trenches 55 and 56 are formed on the main surface 20a on both sides of the stripe mesa structure 54. The trenches 55 and 56 extend in the X-axis direction. The width of each of the trenches 55 and 56 in the Y-axis direction is, for example, in the range of 1 to 5 µm. The depth of each of the trenches 55 and 56 is, for example, in the range of 2 to 4 µm. In the present embodiment, the bottom surfaces of the trenches 55 and 56 reach the main surface 20a of the substrate 20. An insulating protection film 57 is formed on the inner wall surfaces and the bottom surfaces of the trenches 55 and 56 and on the p-type semiconductor region 53 outside the trenches 55 and 56. The insulating protection film 57 is composed of, for example, a dielectric film of $SiO_2$, SiON, or SiN.

The side surfaces 54a and 54b of the stripe mesa structure 54 are buried with the resin layer 38. To be specific, the trenches 55 and 56 are filled with the resin layer 38, and the resin layer 38 is also formed on the p-type semiconductor region 53 outside the trenches 55 and 56. The resin layer 38 is composed of the same resin material as the resin layer 38 of the first optical semiconductor element 30 described above. The thickness of the resin layer 38 is substantially the same as that of the resin layer 38 of the first optical semiconductor element 30 described above. However, in the case of the second optical semiconductor element 50, the resin layer 38 is formed on the p-type semiconductor region 53, which is different from that of the first optical semiconductor element 30. Thus, the height of the surface of the resin layer 38 with respect to the back surface 20b is larger than the height of the surface of the resin layer 38 of the first optical semiconductor element 30.

The resin layer 38 has an opening 38a above the stripe mesa structure 54. The electrode 60 (second electrode) is formed in the opening 38a. The electrode 60 is directly in contact with the p-type contact layer of the p-type semiconductor region 53 through the opening 38a. The electrode 60 forms an Ohmic contact with a p-type contact layer of the p-type semiconductor region 53. The electrode 60 has a layered structure similar to that of the electrode 40 of the first optical semiconductor element 30. As illustrated in FIG. 1, the electrode 60 has a shape extending in the X-axis direction on the stripe mesa structure 54 of the second optical semiconductor element 50. The electrode 41 is formed on the back surface 20b of the substrate 20.

A bonding pad 62 is disposed near the electrode 60. The bonding pad 62 is formed on the resin layer 38. The bonding pad 62 includes a barrier metal layer 62a, a Au-plating layer 62b, and a wiring portion 62c. The structures of the barrier metal layer 62a, the Au-plating layer 62b, and the wiring portion 62c are respectively similar to those of the barrier metal layer 42a, the Au-plating layer 42b, and the wiring portion 42c of the first optical semiconductor element 30. The thickness of the bonding pad 62 is substantially the same as that of the bonding pad 42 of the first optical semiconductor element 30. However, the height $H_2$ of the bonding pad 62 illustrated in FIG. 2 (the distance from the back surface 20b to the upper surface of the Au-plating layer 62b) is larger than the height $H_1$ of the bonding pad 42 of the first optical semiconductor element 30.

A dummy pad 63 is formed on the resin layer 38 on a side opposite to a side on which the bonding pad 62 is disposed with the electrode 60 therebetween. As with the bonding pad 62, the dummy pad 63 includes a barrier metal layer 63a and a Au-plating layer 63b. The shape of the dummy pad 63 in plan view and the height of the dummy pad 63 from the main surface 20a are the same as those of the bonding pad 62.

A high reflection (HR) film 44, for example, is formed as a coating film on a facet 30a of the first optical semiconductor element 30 that intersects the optical waveguide axis L. A high reflection (HR) film 64, for example, is formed as a coating film on a facet 50a of the second optical semiconductor element 50 that intersects the optical waveguide axis L. The high reflection (HR) films 44 and 64 are preferably composed of, for example, a multilayered film of $TiON/MgF_2$ or $TiO_2/SiO_2$ or a single SiN layer.

Figure 4:
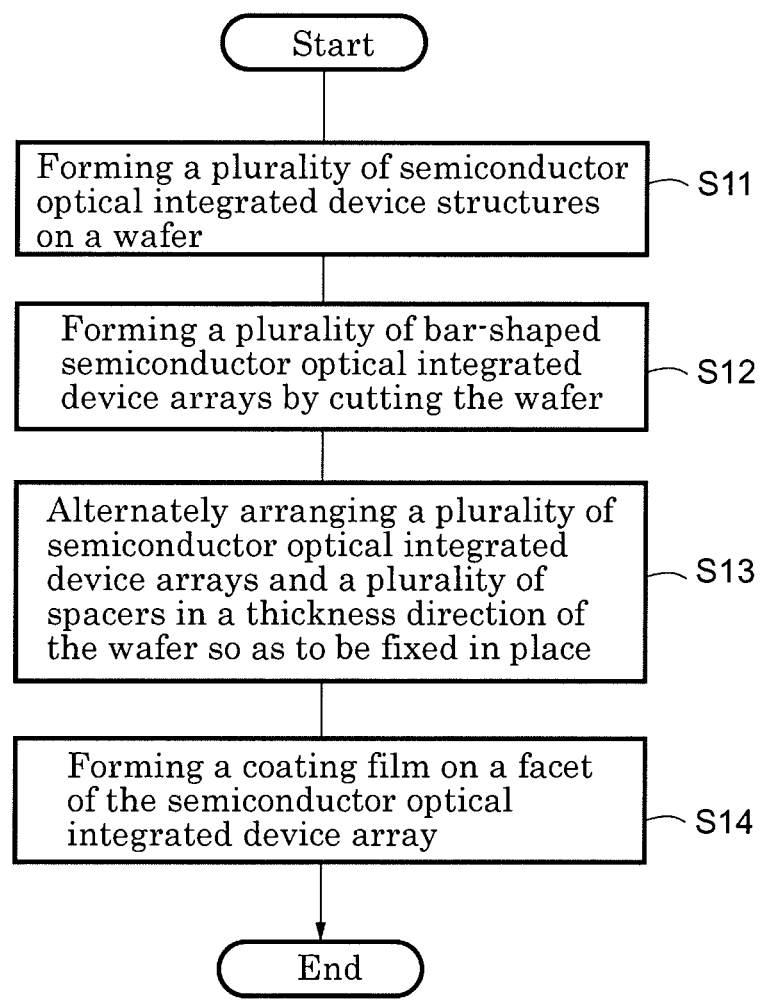
FIG. 4 is a flowchart of an example of a method of making the semiconductor optical integrated device.

A method of making the semiconductor optical integrated device 10 having the abovementioned structure will be described. FIG. 4 is a flowchart of an example of the method of making the semiconductor optical integrated device 10.

First, a plurality of semiconductor optical integrated device structures are formed on a wafer to become the substrate 20 so as to be arranged in the X-axis direction (first direction) and in the Y-axis direction (second direction) (device-forming step S11). The semiconductor optical integrated device structures are made through the process described below.

First, the n-type semiconductor region 31, the active layer 32, and the p-type semiconductor region 33 of the first optical semiconductor element 30 are sequentially grown on the main surface of the wafer to become the substrate 20. Next, a mask (not shown) composed of, for example, a dielectric film of $SiO_2$, SiON, or SiN is formed on a region of the main surface to become the first optical semiconductor element 30. Next, the n-type semiconductor region 31, the active layer 32, and the p-type semiconductor region 33 that have been formed in a region to become the second optical semiconductor element 50 are etched away by using the mask. Then, the n-type semiconductor region 51, the core layer 52, and the p-type semiconductor region 53 of the second optical semiconductor element 50 are selectively grown on the region of the main surface by using a butt-joint method (butt-joint selective area growth).

Subsequently, the n-type semiconductor region 31, the active layer 32, and the p-type semiconductor region 33 of the first optical semiconductor element 30 are etched by using a stripe mask (not shown), and thereby the stripe mesa structure 34 is formed. Next, the burying semiconductor regions 35 and 36 are grown on the main surface of the wafer, which has been exposed due to the etching, and on the side surfaces of the stripe mesa structure 34. In order to grow the burying semiconductor regions 35 and 36 at this time, comparatively large regions on both sides of the stripe mesa structure 34 are etched when forming the stripe mesa structure 34. The trenches 55 and 56 are formed by etching the n-type semiconductor region 51, the core layer 52, and the p-type semiconductor region 53 of the second optical semiconductor element 50 by using a stripe mask (not shown), and thereby the stripe mesa structure 54 is formed. The reason for forming the stripe mesa structure 54 by forming the trenches 55 and 56 having comparatively narrow widths is to reduce the amount of contraction of the resin layer 38, with which the trenches 55 and 56 are filled, during heat treatment. Moreover, by forming the stripe mesa structure 54 having the comparatively narrow trenches 55 and 56, the electrode 60 and the wiring portion 62c formed in later steps are prevented from coming off. To obtain good light-propagation characteristics, it is preferable that a dry etching method (for example, inductively coupled plasma reactive ion etching (ICP-RIE)) is used as the etching method for forming the stripe mesa structure 34 and the stripe mesa structure 54, because a highly vertical shape and a smooth surface can be obtained by dry etching.

Then, after forming the insulating protection films 37 and 57, the resin layer 38 is applied to the entire surface of the wafer. Subsequently, openings are formed in the resin layer 38 and the insulating protection films 37 and 57 on the stripe mesa structures 34 and 54. Then, the electrodes 40 and 60 and the barrier metal layers 42a and 62a are formed. Subsequently, the Au-plating layers 42b and 62b are formed. The opening in the resin layer 38 can be appropriately formed by, for example, plasma etching using $CF_4$ gas or $O_2$ gas. The electrodes 40 and 60 and the barrier metal layers 42a and 62a are formed by using, for example, a lift-off process.

Subsequently, by cutting the wafer in the Y-axis direction, a plurality of bar-shaped semiconductor optical integrated device arrays are formed (cutting step S12). Each of the bar-shaped semiconductor optical integrated device arrays includes two or more semiconductor optical integrated devices. The semiconductor optical integrated devices in the semiconductor optical integrated device array are arranged linearly in the Y-axis direction. In this step, facets of the semiconductor optical integrated device arrays that intersect the X-axis direction (the facets 30a and 50a illustrated in FIGS. 1 and 2) are formed by, for example, cleavage.

Subsequently, the plurality of semiconductor optical integrated device arrays and a plurality of spacers are alternately arranged in the thickness direction of the wafer (i.e. the Z-axis direction shown in FIGS. 1 to 3B) so as to be fixed in place (arrangement step S13). The spacer has a bar-like shape and is composed of, for example, Si, a ceramic, or the like. The width of the spacer in the X-axis direction is substantially the same as that of the semiconductor optical integrated device array. The length of the spacer in the Y-axis direction is larger than that of the semiconductor optical integrated device array. Subsequently, the high reflection (HR) films 44 and 64 shown in FIGS. 1 and 2 are formed as coating films on the facets of the semiconductor optical integrated device arrays (film-forming step S14). The high reflection (HR) films 44 and 64 can be appropriately formed by using, for example, a chemical vapor deposition (CVD) method or a sputtering method.

After performing the steps described above, the semiconductor optical integrated device arrays are cut into chips by, for example, cleavage, and thereby fabrication of the semiconductor optical integrated device 10 illustrated in FIGS. 1 to 3B is completed.

Figure 5:
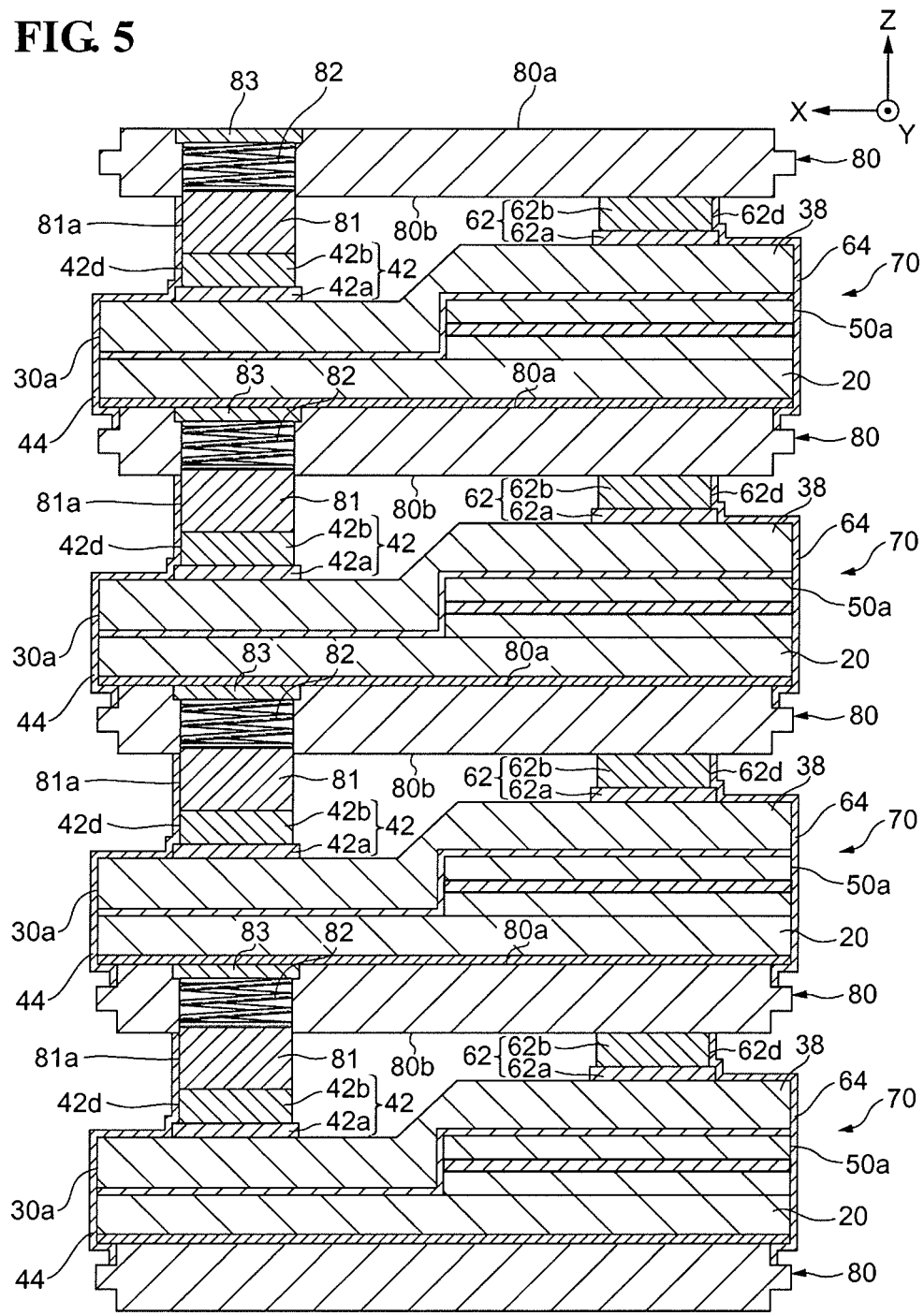
FIG. 5 is a sectional view of semiconductor optical integrated device arrays and spacers that are alternately arranged in an arrangement step and a film-forming step of the embodiment.
Figure 6:
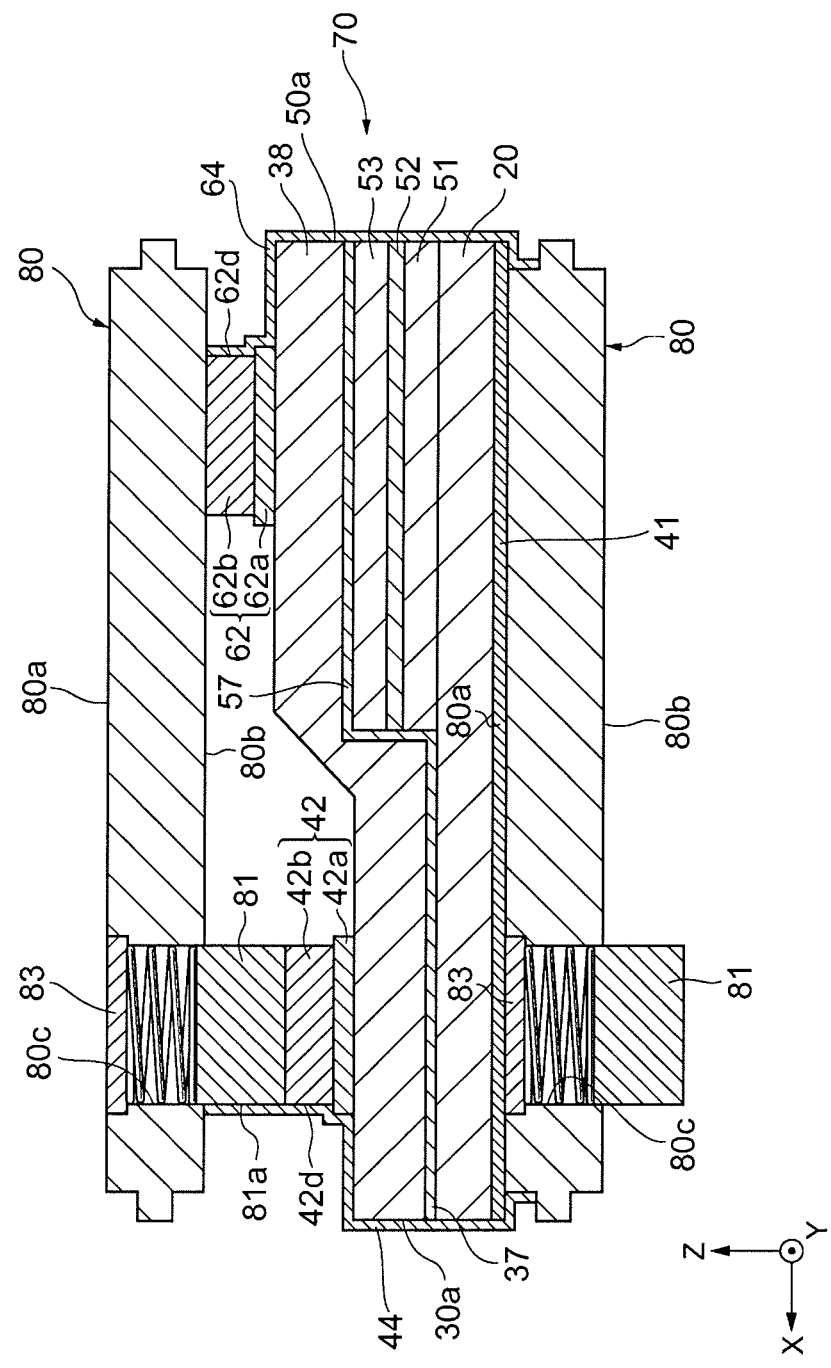
FIG. 6 is a sectional view of one of the semiconductor optical integrated device arrays and spacers adjacent to the semiconductor optical integrated device array.

FIG. 5 is a sectional view illustrating the semiconductor optical integrated device arrays 70 and spacers 80 that are alternately arranged in the arrangement step S13 and the film-forming step S14 of the present embodiment, taken along a plane extending in the direction in which light is guided (the X-axis direction). FIG. 6 is an enlarged sectional view illustrating one of the plurality of semiconductor optical integrated device arrays 70 and the spacers 80 adjacent to the semiconductor optical integrated device array 70.

As illustrated in FIGS. 5 and 6, in the arrangement step S13, the plurality of semiconductor optical integrated device arrays 70 and the plurality of spacers 80 are alternately arranged in the thickness direction of the wafer (substrate 20) so as to be fixed in place. One side 80a of each of the spacers 80 is in contact with the electrode 41, which is disposed on the back surface of the semiconductor optical integrated device array 70 that faces the side 80a. The other side 80b is in contact with the bonding pad 62 and the dummy pad 63 (see FIG. 1) of the semiconductor optical integrated device array 70 that faces the side 80b.

Each of the plurality of spacers 80 according to the present embodiment includes a movable portion 81. The movable portion 81 is on the side 80b of the spacer 80 and faces the bonding pad 42 and the dummy pad 43. The movable portion 81 is composed of the same material as the spacer 80, such as Si or a ceramic. The movable portion 81 protrudes from the side 80b of the spacer 80. The movable portion 81 is fitted into a recess 80c, which is formed in the side 80b, so as to be displaceable (slidable) in the thickness direction of the spacer 80. Thus, the movable portion 81 is displaceable in the protruding direction (Z-axis direction). An elastic member 82, such as a spring, is disposed in the recess 80c. Due to the elastic member 82, the movable portion 81 is elastically deformable in the protruding direction (Z-axis direction). One end of the elastic member 82 is fixed to the spacer 80 through a fixing portion 83 disposed in the side 80a of the spacer 80.

As illustrated in FIGS. 5 and 6, when the plurality of semiconductor optical integrated device arrays 70 and the plurality of spacers 80 are alternately arranged, the movable portion 81 is in contact with the bonding pad 42 and the dummy pad 43 of the semiconductor optical integrated device array 70 that faces the movable portion 81. It is preferable that an outer side surface 81a of the movable portion 81 in the X-axis direction be flush with the outer side surface 42d of the bonding pad 42 and the outer side surface (not shown) of the dummy pad 43 in the direction.

Figure 7:
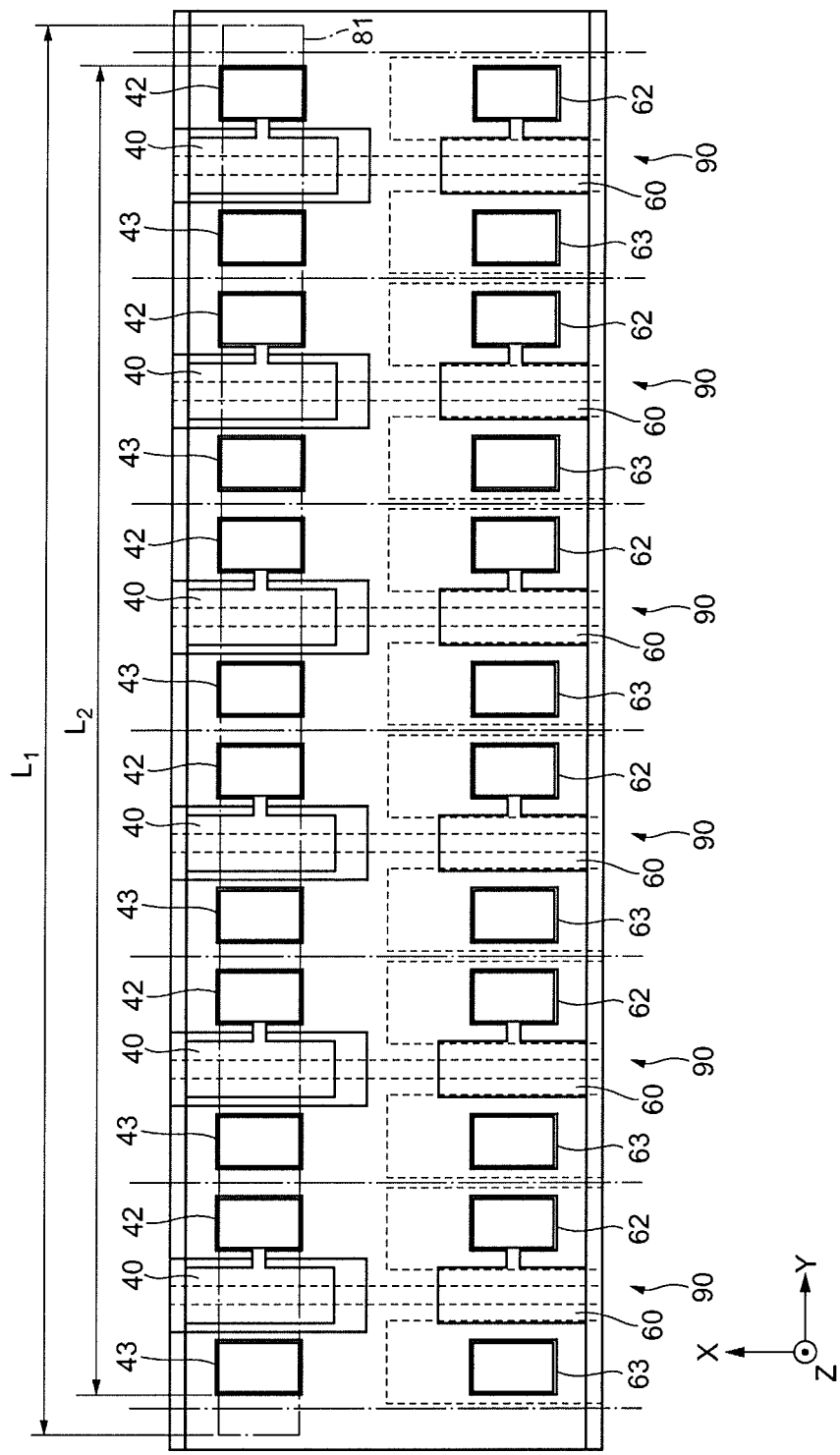
FIG. 7 is a plan view of one semiconductor optical integrated device array.

FIG. 7 is a plan view of one semiconductor optical integrated device array 70. In FIG. 7, a plurality of structural portions 90, each corresponding to the semiconductor optical integrated device 10 illustrated in FIGS. 1 to 3B, are arranged in the Y-axis direction. An imaginary line representing the position and the size of the movable portion 81 of the spacer 80 is also shown in FIG. 7. As illustrated in FIG. 7, the movable portion 81 extends in the Y-axis direction (i.e. the longitudinal direction of the spacer 80). One movable portion 81 is in contact with the bonding pads 42 and the dummy pads 43 of the plurality of structural portions 90. It is preferable that the length $L_1$ of the movable portion 81 in the Y-axis direction be larger than the distance $L_2$ illustrated in FIG. 7. Here, the distance $L_2$ is the distance from the outer side surface of the bonding pad 42 of the semiconductor optical integrated device (structural portion 90) that is located at one end of the semiconductor optical integrated device array 70 in the Y-axis direction to the outer side surface of the bonding pad 42 of the semiconductor optical integrated device (structural portion 90) that is located at the other end of the semiconductor optical integrated device array 70 in the Y-axis direction.

Referring back to FIGS. 5 and 6, in the film-forming step S14, the high reflection (HR) film 44 is formed on the facet 30a of the semiconductor optical integrated device array 70, on the side surface 42d of the bonding pad 42, and on the side surface 81a of the movable portion 81. The high reflection (HR) film 64 is formed on the facet 50a of the semiconductor optical integrated device array 70 and on a side surface 62d of the bonding pad 62.

Figure 8:
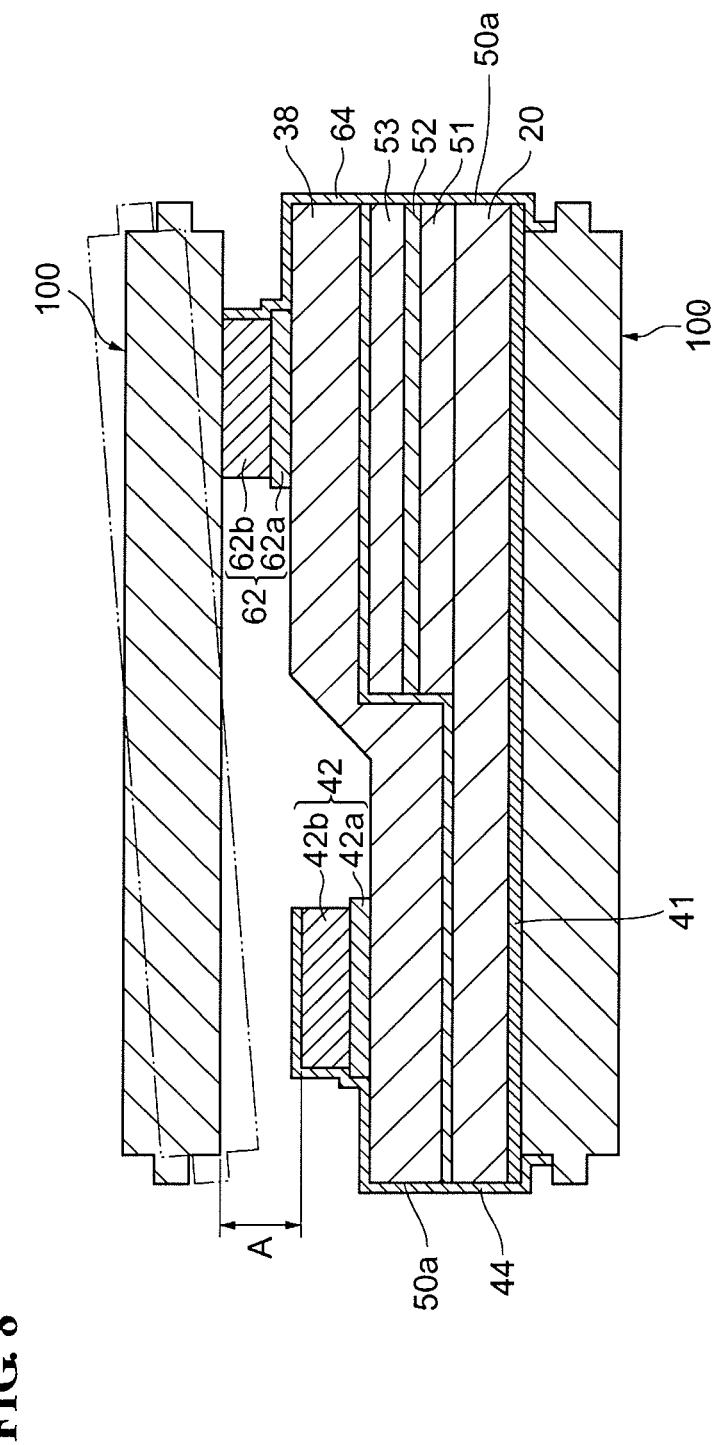
FIG. 8 illustrates a semiconductor optical integrated device array that is fixed in place by using a conventional spacer.

As heretofore described, in the method of making the semiconductor optical integrated device according to the present embodiment, the height $H_1$ of the bonding pad 42 from the back surface 20b of the substrate 20 is smaller than the height $H_2$ of the bonding pad 62 from the back surface 20b. This difference in the height $H_1$ and the height $H_2$ occurs due to the process of making the semiconductor optical integrated device. That is, it is difficult to uniformly flatten the resin layer 38 because the areas of regions to be etched on both sides of the stripe mesa structures 34 and 54 are considerably different from each other. As illustrated in FIG. 8, if such a semiconductor optical integrated device array 70 is fixed in place by using a conventional spacer 100, a gap A is formed between the bonding pad 42 and the spacer 100. Due to the existence of the gap A, it is difficult to stably fix the semiconductor optical integrated device array 70 in place. Moreover, a coating-film material may flow to a surface of the bonding pad 42, and thereby the surface of the bonding pad 42 may be covered by the high reflection (HR) film 44. If the surface of the bonding pad 42 is covered by the high reflection (HR) film 44, a bonding wire adheres poorly to the bonding pad 42 in wire-bonding process. So, it is difficult to connect the bonding wire to the bonding pad 42, mechanically and electrically.

To prevent this from occurring, in the method of making the semiconductor optical integrated device according to the present embodiment, the movable portion 81 of the spacer 80 facing the bonding pad 42 protrudes toward the bonding pad 42 and is displaceable in the protruding direction (Z-axis direction). Thus, when the plurality of semiconductor optical integrated device arrays 70 and the plurality of spacers 80 are alternately arranged in the arrangement step S13, the movable portion 81 can come into contact with the bonding pad 42 by protruding toward the bonding pad 42. Thus, generation of a gap between the bonding pad 42 and the spacer 80 can be prevented. In particular, because the movable portion 81 is displaceable in the protruding direction (Z-axis direction), the amount of protrusion of the movable portion 81 can be adjusted. Accordingly, a failure in that the movable portion 81 fails to come into contact with the bonding pad 42 can be prevented. Furthermore, a failure in that the movable portion 81 protrudes excessively and the spacer 80 becomes inclined with respect to the semiconductor optical integrated device array 70 can be prevented. As described above, with the method of making the semiconductor optical integrated device according to the present embodiment, the semiconductor optical integrated device array 70 can be stably fixed in place when forming the high reflection (HR) films 44 and 64 on the facets 30a and 50a of the semiconductor optical integrated device array 70. Moreover, flow of a coating-film material to a surface of the bonding pad 42 can be reduced.

It is preferable, as in the present embodiment, that the movable portion 81 of the spacer 80 can elastically protrude toward the bonding pad 42. With such a structure, the amount of protrusion of the movable portion 81 can be easily adjusted, and thereby generation of a gap between the bonding pad 42 and the spacer 80 can be appropriately prevented.

It is preferable, as in the present embodiment, that the length $L_1$ of the movable portion 81 in the Y-axis direction be larger than the length $L_2$ illustrated in FIG. 7. In this case, the relative positions of the movable portion 81 and the bonding pad 42 in the Y-axis direction may have tolerances (corresponding to the allowable amount of displacement of the spacer 80 in the longitudinal direction).

A method of making a semiconductor optical integrated device according to the present invention is not limited to the embodiment described above, and may be modified in various ways. For example, in the embodiment described above, a semiconductor laser is used as an example of the first optical semiconductor element and a semiconductor optical modulator is used as an example of the second optical semiconductor element. However, first and second optical semiconductor elements according to the present invention are not limited to these and may be any semiconductor optical devices having an optical waveguide structure.

In the embodiment described above, the movable portion 81 is configured to be elastically deformable. However, the amount of protrusion of the movable portion 81 may be adjusted by using, for example, a pressing screw that is screwed into the side 80a of the spacer 80.

In the embodiment described above, the high reflection (HR) films 44 and 64 are formed on the facets 30a and 50a of the semiconductor optical integrated device array 70. However, the present invention can be applied to the case where anti-reflection (AR) films are formed on the facets of the semiconductor optical integrated device array.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method of making a semiconductor optical integrated device comprising the steps of:

preparing a substrate having a main surface;

forming semiconductor integrated devices on the main surface of the substrate, the semiconductor integrated devices being arranged in a first direction and in a second direction that intersects the first direction, a plurality of the semiconductor integrated devices each including a first optical semiconductor element and a second optical semiconductor element disposed adjacent to the first optical semiconductor element in the first direction;

forming a plurality of bar-shaped semiconductor optical integrated device arrays by cutting the substrate in the second direction, each of the semiconductor optical integrated device arrays including two or more semiconductor optical integrated devices arranged linearly in the second direction;

alternately arranging the plurality of semiconductor optical integrated device arrays and a plurality of spacers in a thickness direction of the substrate so as to be fixed in place; and forming a coating film on a facet of each semiconductor optical integrated device array, wherein the first optical semiconductor element includes a first stripe mesa structure, a first electrode disposed on the first stripe mesa structure, and a first bonding pad electrically connected to the first electrode, the first stripe mesa structure including a first optical waveguide layer, the second optical semiconductor element includes a second stripe mesa structure, a second electrode disposed on the second stripe mesa structure, and a second bonding pad electrically connected to the second electrode, the second stripe mesa structure including a second optical waveguide layer optically coupled to the first optical waveguide layer, and each spacer has a movable portion that faces the first bonding pad of one first optical semiconductor element, that protrudes toward the first bonding pad of said one first optical semiconductor element and is displaceable in a protruding direction, and that has a length in the second direction that is larger than a distance between outer side surfaces of the first bonding pads of semiconductor optical integrated devices that are located at opposite ends of a semiconductor optical integrated device array.

2. The method of making a semiconductor optical integrated device according to claim 1, wherein, in the step of forming the semiconductor integrated devices, the first bonding pad has a height from a back surface of the substrate, the height of the first bonding pad being different from a height of the second bonding pad from the back surface of the substrate.

3. The method of making a semiconductor optical integrated device according to claim 1, wherein the movable portion of the spacer is elastically deformable in the protruding direction.

4. The method of making a semiconductor optical integrated device according to claim 1,
wherein the step of forming the semiconductor integrated devices includes a step of forming a first dummy pad on a side opposite to a side on which the first bonding pad is disposed with the first electrode therebetween, and
wherein the first dummy pad is formed simultaneously with the first bonding pad.

5. The method of making a semiconductor optical integrated device according to claim 1,
wherein the step of forming the semiconductor integrated devices includes a step of forming a second dummy pad on a side opposite to a side on which the second bonding pad is disposed with the second electrode therebetween, and
wherein the second dummy pad is formed simultaneously with the second bonding pad.

6. The method of making a semiconductor optical integrated device according to claim 1,
wherein the step of forming the semiconductor integrated devices includes a step of forming a resin layer around the first stripe mesa structure, and
wherein the first bonding pad is formed on the resin layer.

7. The method of making a semiconductor optical integrated device according to claim 1,
wherein the step of forming the semiconductor integrated devices includes a step of forming a resin layer around the second stripe mesa structure, and
wherein the second bonding pad is formed on the resin layer.

* * * * *